United States Patent
Lian et al.

(10) Patent No.: US 11,789,299 B1
(45) Date of Patent: Oct. 17, 2023

(54) DRIVING SUBSTRATE AND DISPLAY PANEL

(71) Applicant: TCL China Star Optoelectronics Technology Co., Ltd., Shenzhen (CN)

(72) Inventors: Zhengqin Lian, Shenzhen (CN); Yoonsung Um, Shenzhen (CN); Lixia Li, Shenzhen (CN); Chungching Hsieh, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 18/079,250

(22) Filed: Dec. 12, 2022

(30) Foreign Application Priority Data

Aug. 30, 2022 (CN) .......................... 202211055405.6

(51) Int. Cl.
| | |
|---|---|
| *G02F 1/133* | (2006.01) |
| *H01L 27/12* | (2006.01) |
| *G02F 1/1362* | (2006.01) |
| *G02F 1/1343* | (2006.01) |
| *G09G 3/36* | (2006.01) |

(52) U.S. Cl.
CPC .... *G02F 1/13306* (2013.01); *G02F 1/134309* (2013.01); *G02F 1/136209* (2013.01); *G02F 1/136218* (2021.01); *G02F 1/136286* (2013.01); *H01L 27/1255* (2013.01); *G09G 3/36* (2013.01); *G09G 2320/0209* (2013.01)

(58) Field of Classification Search
CPC .......... G02F 1/13306; G02F 1/136218; G02F 1/134309; G02F 1/136209; G02F 1/136286; H01L 27/1255; G09G 3/36
See application file for complete search history.

(56) References Cited

U.S. PATENT DOCUMENTS

| | | | |
|---|---|---|---|
| 2006/0146254 A1* | 7/2006 | Kim ................... | G02F 1/134363 349/141 |
| 2011/0157534 A1* | 6/2011 | Hong ................. | G02F 1/134363 349/141 |
| 2017/0090245 A1* | 3/2017 | Tsuchiya .............. | H10K 59/126 |

* cited by examiner

*Primary Examiner* — Anne M Hines
(74) *Attorney, Agent, or Firm* — Luedeka Neely Group, P.C.

(57) ABSTRACT

A driving substrate and a display panel are provided. The driving substrate includes a plurality of driving units. Each of driving unit includes a first metal layer. The first metal layer includes a shielding common electrode and a storage capacitance common electrode. A light-shielding portion of the shielding common electrode extends toward the storage capacitance common electrode. A pixel accommodating region is enclosed by the shielding common electrode and the storage capacitance common electrode. There is a gap between the light-shielding portion of the shielding common electrode and the storage capacitance common electrode. Thereby, signals can be transmitted to the shielding common electrode and the storage capacitance common electrode separately, a same signal or different signals can be transmitted to the shielding common electrode and the storage capacitance common electrode, to achieve independent control of the signals on the shielding common electrode and the storage capacitance common electrode.

20 Claims, 5 Drawing Sheets

Prior Art

FIG. 1

Prior Art

FIG. 2

Prior Art

DRIVING SUBSTRATE AND DISPLAY PANEL

FIELD OF INVENTION

The present application relates to a field of display technology, and in particular, to a driving substrate and a display panel.

BACKGROUND OF INVENTION

Figure 1:
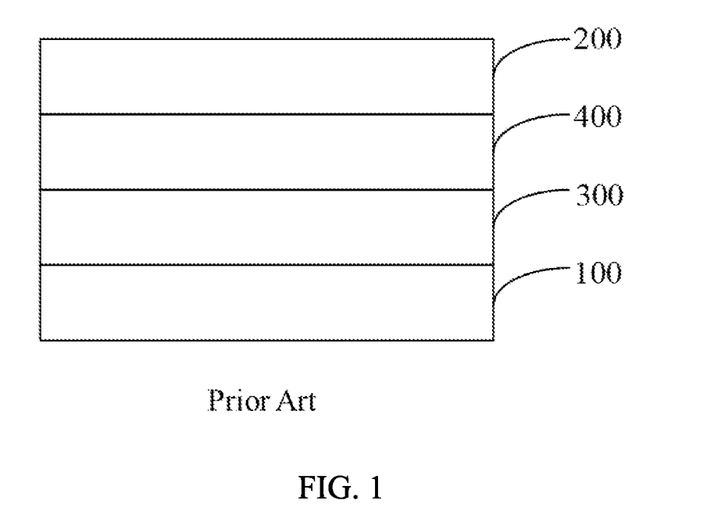
FIG. 1 shows a schematic diagram of a structure of a MIS capacitor in the prior art.
Figure 2:
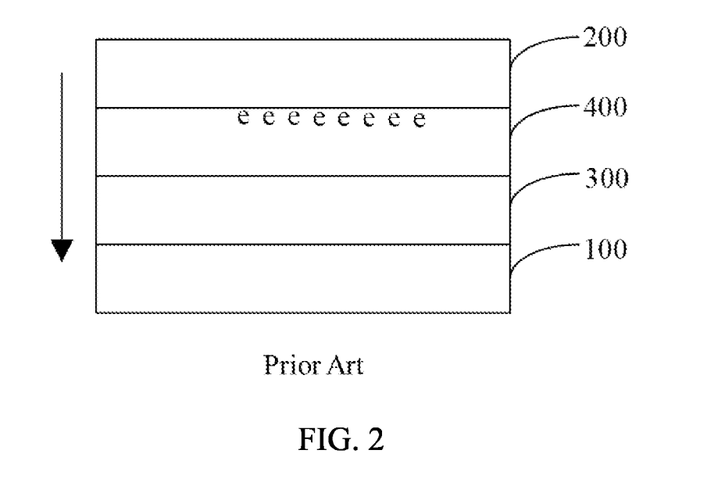
FIG. 2 shows a carrier distribution diagram of the MIS capacitor in the prior art under a positive polarity.
Figure 3:
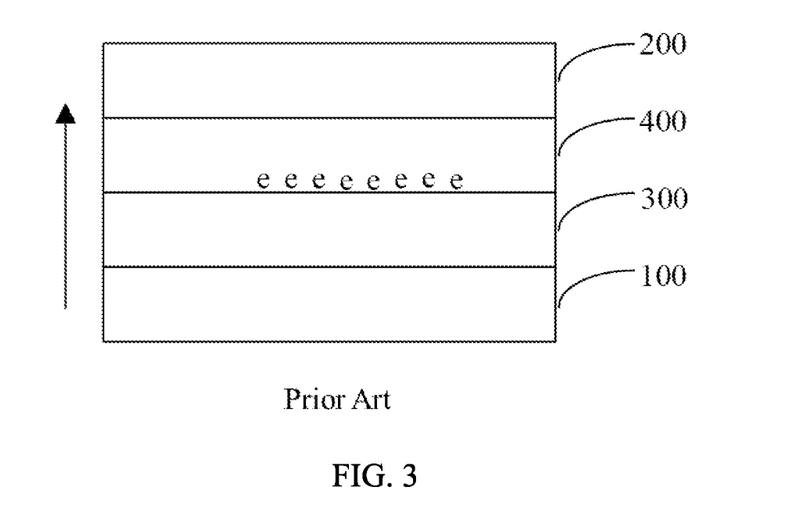
FIG. 3 shows a carrier distribution diagram of the MIS capacitor in the prior art under a negative polarity.

In a process of manufacturing LCD panels, a thin film transistor (TFT) substrate is manufactured by using a 4-channel mask process in order to reduce costs. In the 4-channel mask process, a semiconductor layer is provided under a second metal layer of the TFT substrate, and a metal-insulator-semiconductor (MIS) capacitance is formed between a data line on the second metal layer and a common electrode on a first metal layer, as shown in FIG. 1. In conventional technology, a shielding common electrode and a storage capacitance common electrode included on the first metal layer are connected as one, which makes impossible to control the signals on the shielding common electrode and the storage capacitance common electrode independently. As shown in FIG. 2 and FIG. 3, the carriers in the semiconductor layer are redistributed when the data lines on the second metal layer switched between a positive polarity and a negative polarity, which making the charge positions are different. Thereby effective spacings between the data lines on the second metal layer and the common electrode on the first metal layer are different, resulting in an asymmetric MIS capacitance occurrence when the data lines on the second metal layer are switched between the positive polarity and the negative polarity, leading to a horizontal line crosstalk phenomenon in the LCD panel.

SUMMARY OF INVENTION

Based on the above-mentioned problems, it is necessary to provide a driving substrate and a display panel for the problem that the signals of the shielding common electrode and the storage capacitance common electrode cannot be controlled independently in a conventional liquid crystal panel.

In order to achieve the above purpose, on a one hand, the present application embodiment provides a driving substrate including a plurality of driving units, wherein each of the driving unit includes a first metal layer, and wherein the first metal layer includes a shielding common electrode and a storage capacitance common electrode, wherein a light-shielding portion of the shielding common electrode extends toward the storage capacitance common electrode, wherein a pixel accommodating region is enclosed by the shielding common electrode and the storage capacitance common electrode, and wherein there is a gap between the light-shielding portion of the shielding common electrode and the storage capacitance common electrode.

In one embodiment of the present application, the storage capacitance common electrode transmits a first voltage signal, and wherein a voltage of the first voltage signal is greater than a voltage of a data voltage signal of the driving substrate.

In one embodiment of the present application, the shielding common electrode transmits a second voltage signal, wherein a voltage of the second voltage signal is less than a voltage of a threshold voltage signal, and wherein the voltage of the threshold voltage signal is a minimum value that causes a light leakage of the driving substrate.

In one embodiment of the present application, the voltage of the second voltage signal is less than the voltage of the first voltage signal.

In one embodiment of the present application, the voltage of the first voltage signal is greater than or equal to 20V, and wherein the voltage of the second voltage signal is greater than or equal to 6V and less than 14V.

In one embodiment of the present application, the gap between the light-shielding portion of the shielding common electrode and the storage capacitance common electrode is greater than or equal to 5 micrometers and less than or equal to 15 micrometers.

In one embodiment of the present application, the driving substrate further includes a first signal source that is connected to the storage capacitance common electrode and transmits the first voltage signal to the storage capacitance common electrode.

In one embodiment of the present application, the driving substrate further includes a second signal source that is connected to the shielding common electrode, and transmits a second voltage signal to the shielding common electrode, and wherein a voltage of the second voltage signal is less than the voltage of the first voltage signal.

In one embodiment of the present application, the driving unit further includes a second metal layer disposed in a different layer from the first metal layer, wherein the second metal layer includes a data line, a drain electrode layer, and a source electrode layer, and wherein the first metal layer further includes a gate scanning line, and wherein the source electrode layer is connected to the data line, and the source electrode layer is disposed corresponding to the gate scanning line, wherein the drain electrode layer is connected to the source electrode layer, and the drain electrode layer is disposed corresponding to the storage capacitance common electrode.

On the other hand, the present application embodiment provides a display panel including a control main board, a display layer, and the driving substrate as described above, wherein the control main board is connected to the driving substrate, and wherein the driving substrate is configured to drive the liquid crystal molecules in the liquid crystal layer to deflect.

One of the technical embodiments described above has the following advantages and beneficial effects.

The driving substrate provided in each embodiment of the present application includes a plurality of driving units. Each of the driving unit includes a first metal layer. A shielding common electrode and a storage capacitance common electrode are included in the first metal layer. The shielding common electrode includes a light-shielding portion. The light-shielding portion of the shielding common electrode extends toward the storage capacitance common electrode. A pixel accommodating region is enclosed by the shielding common electrode and the storage capacitance common electrode. There is a gap between the light-shielding portion of the shielding common electrode and the storage capacitance common electrode, so that the shielding common electrode and the storage capacitance common electrode are not connected to each other. Thereby, signals can be transmitted to the shielding common electrode and the storage capacitance common electrode separately, a same signal or different signals can be transmitted to the shielding common electrode and the storage capacitance common electrode, to achieve independent control of the signals on the shielding common electrode and the storage capacitance common electrode.

DETAILED DESCRIPTION OF EMBODIMENTS

For a purpose of understanding the present application, the present application is fully described below with reference to the relevant accompanying figures. The preferred embodiments of the present application are provided in the accompanying figures. However, the present application can be implemented in many different forms and is not limited to the embodiments described herein. Rather, these embodiments are provided for a purpose of making the disclosure of the present application more thorough and comprehensive.

It should be noted that when an element is considered to be "attached" to another element, it may be directly attached to and integrated with the other element, or there may be a centered element as well. The terms "mount", "end", "other end" and similar expressions used herein are for illustrative purposes only.

Unless otherwise defined, all technical and scientific terms used herein have the same meaning as commonly understood by those skilled in the art to which the present application belongs. The terms used herein in the specification of the present application are for a purpose of describing specific embodiments only and are not intended to limit the present application. The term "and/or" as used herein includes any and all combinations of one or more of the relevant listed items.

A general liquid crystal display panel includes a control main board, a reflective layer, a backlight source, a lower polarizer, a driving substrate, a liquid crystal layer, a color filter, an upper polarizer, and other structures. The control main board is configured to control the entire LCD panel, for example, the control main board is connected to the driving substrate to provide various types of signals for the driving substrate to control the driving substrate. The reflective layer is configured to reflect a light emitted from the backlight source to improve an emissivity of the LCD panel. In one example, the reflective layer may be made of any one of white oil, white glue, copper, aluminum, and silver. The backlight source provides light to the liquid crystal display panel. In one example, the backlight source may be a cold cathode fluorescent lamp or a light emitting diode. The lower polarizer and the upper polarizer allow a natural light from the backlight source to become polarized. The liquid crystal layers change an orientation of the liquid crystals in response to an electric field, thereby changing the passage of light. Specifically, the liquid crystal layers are driven by a driving substrate. Color filters are configured to select a small range of light waves that pass through, including blue filters, red filters, green filters, etc.

Figure 4:
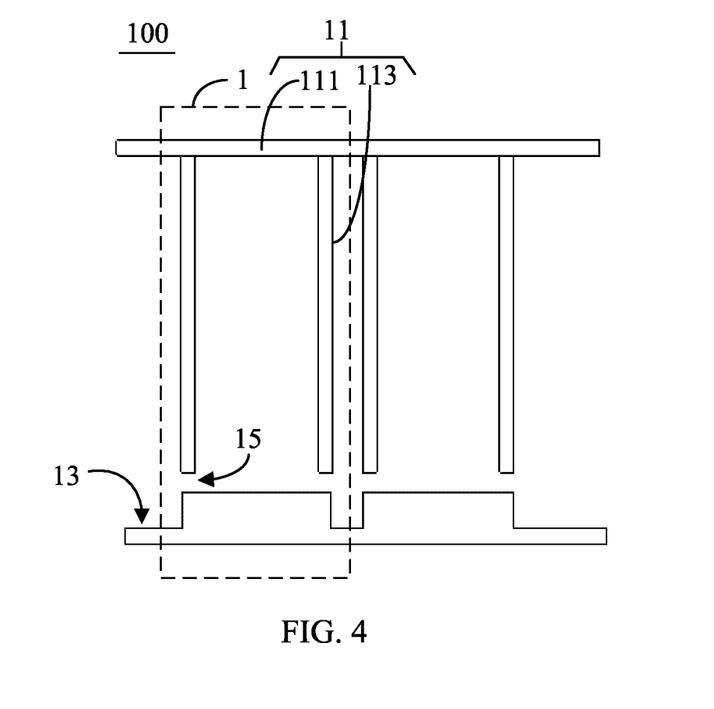
FIG. 4 is a schematic diagram of a structure of a first metal layer of the driving substrate provided by one embodiment of the present application.
Figure 5:
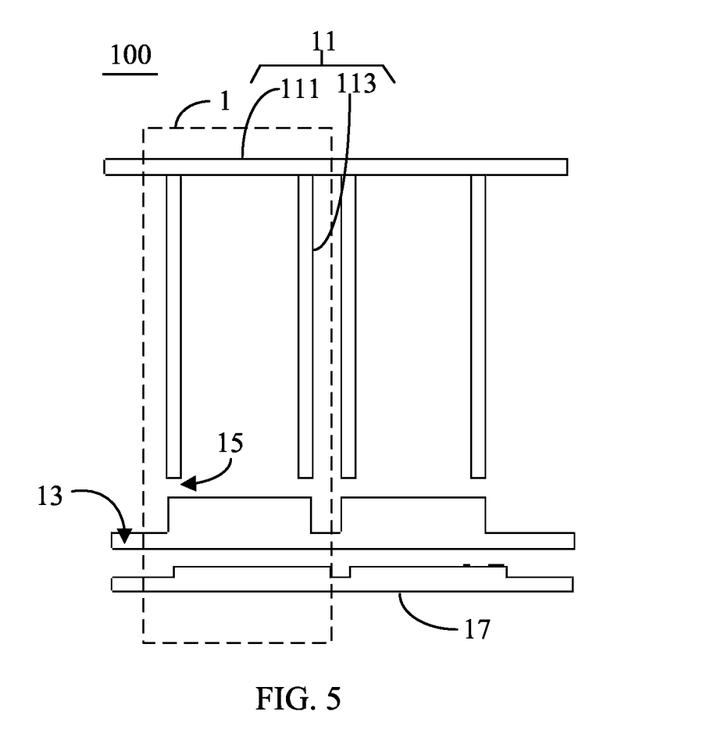
FIG. 5 is a schematic diagram of another structure of the first metal layer of the driving substrate provided by one embodiment of the present application.
Figure 6:
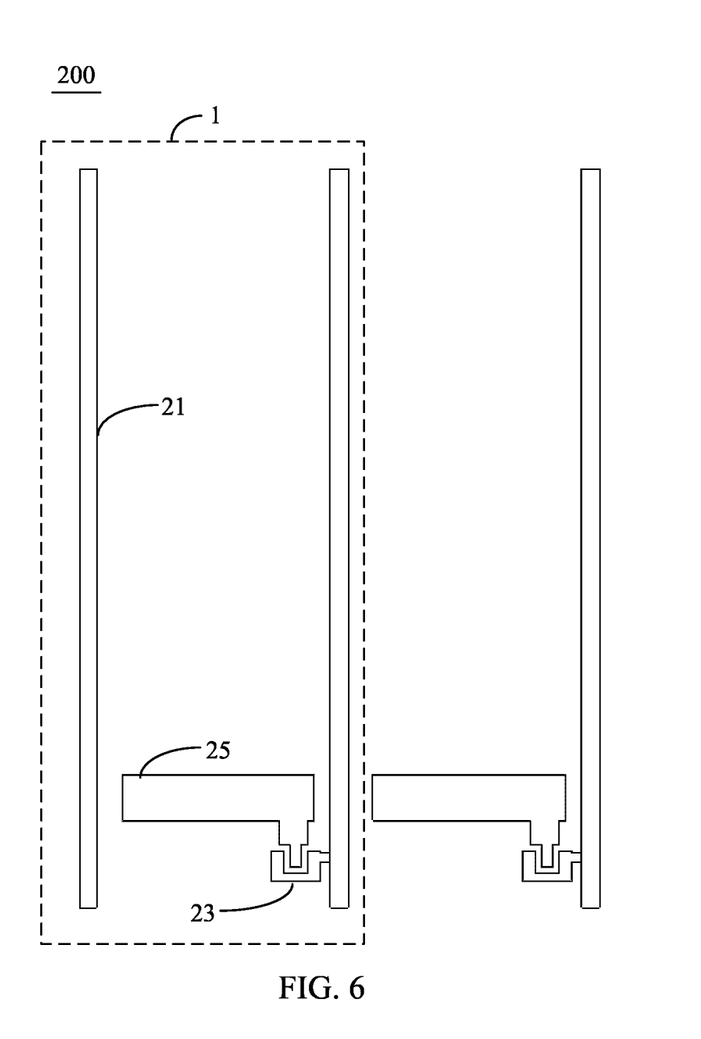
FIG. 6 is a schematic diagram of a structure of a second metal layer of the driving substrate provided by one embodiment of the present application.

In conventional technology, a shielding common electrode and a storage capacitance common electrode included on the first metal layer were connected together, which causes controlling the signals on the shielding common electrode and the storage capacitance common electrode is difficult. To solve the above-mentioned problem, a driving substrate is provided in the present application as shown in FIGS. 4 to 6. The driving substrate consists of a plurality of driving units 1, and the driving units 1 are arranged in vertical and horizontal columns, wherein the driving units 1 in a same horizontal column are connected to each other. Each driving unit 1 supplies power to a pixel anode of a corresponding LCD panel to drive a corresponding pixel to emit light. The number of driving units 1 is confirmed according to a resolution of the LCD panel and an area of the LCD panel, which is not specifically limited here.

As shown in FIGS. 4 and 5, the driving unit 1 includes a first metal layer 100. It should be noted that a first metal layer 100 and a second metal layer 200 are divided according to a sequence of the manufacturing process. The first metal layer 100 precedes the second metal layer 200 in the manufacturing process. The first metal layer 100 is made of an electrically conductive material, for example, copper, molybdenum or aluminum. The first metal layer 100 can be made by any of the following methods: chemical vapor deposition (CVD), physical vapor deposition (PVD), atomic layer deposition (ALD), low pressure chemical vapor deposition (LVCVD), low pressure chemical vapor deposition (LPCVD), laser ablation deposition (LAD), and selective epitaxial growth (SEG).

As shown in FIG. 4, the first metal layer 100 includes a shielding common electrode 11 and a storage capacitance common electrode 13. It should be noted that the shielding common electrode 11 is configured to shield the liquid crystal in the pixel from display problems caused by interference from other external electric fields. The storage capacitance common electrode 13 is configured to store the electric charge. As shown in FIG. 5, the first metal layer 100 also includes a gate scanning line 17, the gate scanning line is connected to a driving circuit of the driving unit 1 to transmit a scanning signal to the driving circuit. The first metal layer 100 includes the shielding common electrode 11 and the storage capacitance common electrode 13, which means that after manufacturing the first metal layer 100, the first metal layer 100 is graphically processed to obtain the shielding common electrode 11 and the storage capacitance common electrode 13.

The shielding common electrode 11 includes a main stem portion 111 and a light-shielding portion 113. The main stem portion 111 is connected to a signal source and transmits a voltage signal output from the signal source. The light-shielding portion 113 is provided on both sides of the pixel to prevent the pixel from leaking light to both sides. Specifically, the light-shielding portion 113 of the shielding common electrode 11 extends toward the storage capacitance common electrode 13. In one embodiment, a number of light-shielding portions 113 is two, and the light-shielding portions 113 are in a shape of an elongated strip. One terminal of the light-shielding portion 113 is connected to the main stem portion 111 and the other terminal is set toward the storage capacitance common electrode 13, i.e., the light-shielding portion 113 is placed horizontally between the main stem portion 111 and the storage capacitance common electrode 13, and the two light-shielding portions 113 are set at a certain distance apart, wherein the distance is set according to a size of the pixels. Since the light-shielding portion 113 extends toward the storage capacitance common electrode 13, the shielding common electrode 11 and the storage capacitance common electrode 13 enclose a pixel accommodating region. The pixel accommodating region is configured to place pixels, i.e., the shielding common electrode 11 and the storage capacitance common electrode 13 are positioned around the pixels. In one embodiment, the main stem portion 111, the light-shielding portion 113 of the shielding common electrode 11, and the storage capacitance common electrode 13 are positioned around the pixels.

For spacing apart the shielding common electrode 11 and the storage capacitance common electrode 13, there is a gap 15 between the light-shielding portion 113 of the shielding common electrode 11 and the storage capacitance common electrode 13. It should be noted that the gap 15 cannot be too small to avoid the light-shielding portion 113 sticking to the storage capacitance common electrode 13 due to the manufacturing process. The gap 15 also cannot be too large to avoid an occurrence of light leakage due to the gap 15 being too large. In one embodiment, the gap 15 between the light-shielding portion 113 of the shielding common electrode 11 and the storage capacitance common electrode 13 is greater than or equal to 5 micrometers and less than or equal to 15 micrometers. For example, the gap 15 between the light-shielding portion 113 of the shielding common electrode 11 and the storage capacitance common electrode 13 is 6 micrometers, the gap 15 between the light-shielding portion 113 of the shielding common electrode 11 and the storage capacitance common electrode 13 is 7 micrometers, and the gap 15 between the light-shielding portion 113 of the shielding common electrode 11 and the storage capacitance common electrode 13 is 8 micrometers. It should be noted that a specific value of the gap 15 serves as an example and there is no specific limitation on it, as long as the above-mentioned gap 15 condition is satisfied.

The driving substrate provided in each embodiment of the present application includes a plurality of driving units. The driving units include a first metal layer. A shielding common electrode and a storage capacitance common electrode are included in the first metal layer. The shielding common electrode includes a light-shielding portion, wherein the light-shielding portion of the shielding common electrode extends toward the storage capacitance common electrode. A pixel accommodating region is enclosed by the shielding common electrode and the storage capacitance common electrode. There is a gap between the light-shielding portion of the shielding common electrode and the storage capacitance common electrode, so that the shielding common electrode and the storage capacitance common electrode are not connected to each other. Thereby, signals can be transmitted to the shielding common electrode and the storage capacitance common electrode separately, a same signal or different signals can be transmitted to the shielding common electrode and the storage capacitance common electrode, to achieve independent control of the signals on the shielding common electrode and the storage capacitance common electrode.

In addition, the driving substrate is a critical component to ensure a normal display of the LCD panel. In order to reduce a manufacturing cost of LCD panels in conventional technology, a 4mask process is used to manufacture the driving substrate. The second metal layer 200 of the driving substrate in the 4mask process is manufactured on top of the semiconductor layer 400, so that the data lines on the second metal layer 200 and the common electrode on the first metal layer 100 of the driving substrate form a capacitor, which is sandwiched between the semiconductor layer. As shown in FIGS. 2 and 3, the carriers (as e in FIG. 2 or 3) in the semiconductor layer 400 are redistributed when the data lines on the second metal layer 200 switched between a positive polarity and a negative polarity, so that the charge positions are different, thereby effective spacings between the data lines on the second metal layer 200 and the common electrode on the first metal layer 100 are different, resulting in asymmetric MIS capacitance when the data lines on the second metal layer 200 are switched between the positive polarity and the negative polarity, leading to a horizontal line crosstalk phenomenon in the LCD panel.

To solve the problem of horizontal line crosstalk phenomenon in the LCD panel, the horizontal line crosstalk phenomenon in the LCD panel is eliminated by separately inputting a first voltage signal to the storage capacitance common electrode 13 on a basis that the shielding common electrode 11 and the storage capacitance common electrode 13 are separated. That is, the first voltage signal is transmitted to the storage capacitance common electrode 13. It should be noted that the first voltage signal needs to eliminate the capacitance asymmetry problem caused by the change between the positive polarity and the negative polarity of the data line 21 of the driving substrate. For this purpose, a voltage of the first voltage signal is greater than a voltage of the data voltage signal of the driving substrate, wherein the data voltage signal is a signal transmitted on the data line 21. It should be noted that the first voltage signal is greater than a maximum value of the positive polarity of the data voltage signal to ensure that even if the positive polarity and the negative polarity of the data voltage signal changes, the first voltage signal is always greater than the data voltage signal, and an electric field direction of the capacitor formed by the data line 21 on the second metal layer 200 and the common electrode on the first metal layer 100 of the driving substrate is determined by the first voltage signal. Since the first voltage signal remains unchanged, so that the electric field direction of the capacitor remains unchanged. In one embodiment, the voltage of the first voltage signal is greater than or equal to 20V. For example, the voltage of the first voltage signal is 22 V, the voltage of the first voltage signal is 24 V, and the voltage of the first voltage signal is 26 V. It should be noted that a specific value of the first voltage signal is for example purposes, and there is no specific limitation on it, as long as the first voltage signal condition described above is satisfied.

In one embodiment, a driving substrate is provided as shown in FIGS. 4 to 6. The driving substrate may be divided into a plurality of driving units 1. The driving substrate includes a plurality of driving units 1. The driving units 1 are arranged in vertical and horizontal columns. In one embodiment, the driving units 1 in a same horizontal column are connected to each other. In another embodiment, the driving units 1 in a same vertical column are connected to each other.

As shown in FIGS. 4 and 5, the driving unit 1 includes a first metal layer 100. It should be noted that the first metal layer 100 and the second metal layer 200 are divided according to a sequence of preparation processes. The first metal layer 100 precedes the second metal layer 200 in the manufacturing process. The first metal layer 100 is made of conductive material, for example, conductive material may be copper, molybdenum, aluminum, silver, gold, or an alloy of any of the above materials, or an alloy of any combination of materials, etc.

The first metal layer 100 includes a shielding common electrode 11 and a storage capacitance common electrode 13. It should be noted that the shielding common electrode 11 is configured to shield the liquid crystal in the pixel from display problems caused by interference from other external electric fields. The storage capacitance common electrode 13 is configured to store electrical charge. The first metal layer 100 also includes a gate scanning line 17, wherein the gate scanning line 17 is connected to a driving circuit of the driving unit 1 to transmit a scan signal to the driving circuit.

The shielding common electrode 11 includes a main stem portion 111 and a light-shielding portion 113. The main stem portion 111 is connected to a signal source to transmit a voltage signal output from the signal source. In one embodiment, a shape of the main stem portion 111 is an elongated strip, and the main stem portions 111 of the shielding common electrode 11 of each driving unit 1 are connected to each other. The light-shielding portion 113 is provided on both sides of the pixel to prevent the pixel from leaking light to both sides. Specifically, the light-shielding portion 113 of the shielding common electrode 11 extends toward the storage capacitance common electrode 13. In one embodiment, a number of light-shielding portions 113 is two, and the light-shielding portions 113 are in a shape of an elongated strip. One terminal of the light-shielding portion 113 is connected to the main stem portion 111 and the other terminal of the light-shielding portion 113 is set toward the storage capacitance common electrode 13, i.e., the light-shielding portion 113 is placed horizontally between the shielding common electrode 11 and the storage capacitance common electrode 13, and the two light-shielding portions 113 are disclosed a certain distance apart, which is disposed according to a size of the pixel.

Since the light-shielding portion 113 extends toward the storage capacitance common electrode 13, the shielding common electrode 11 and the storage capacitance common electrode 13 enclose a pixel accommodating region. In one embodiment, the pixel accommodating region is a rectangular region. The pixel accommodating region is configured to place pixels, i.e., the shielding common electrode 11 and the storage capacitance common electrode 13 are disposed around the pixels. In one embodiment, the main stem portion 111, the light-shielding portion 113 of the shielding common electrode 11, and the storage capacitance common electrode 13 are disposed around the pixels.

In order to separate the shielding common electrode 11 and the storage capacitance common electrode 13 to separately input a first voltage signal to the storage capacitance common electrode 13 to eliminate the horizontal line crosstalk phenomenon of the liquid crystal display panel. There is a gap 15 between the light-shielding portion 113 of the shielding common electrode 11 and the storage capacitance common electrode 13. It should be noted that the gap 15 cannot be too small to avoid the light-shielding portion 113 sticking to the storage capacitance common electrode 13 due to the manufacturing process. The gap 15 also cannot be too large to avoid an occurrence of light leakage due to the gap 15 being too large. In one embodiment, the gap 15 between the light-shielding portion 113 of the shielding common electrode 11 and the storage capacitance common electrode 13 is greater than or equal to 5 micrometers and less than or equal to 15 micrometers. For example, the gap 15 between the light-shielding portion 113 of the shielding common electrode 11 and the storage capacitance common electrode 13 is 9 micrometers, the gap 15 between the light-shielding portion 113 of the shielding common electrode 11 and the storage capacitance common electrode 13 is 10 micrometers, and the gap 15 between the light-shielding portion 113 of the shielding common electrode 11 and the storage capacitance common electrode 13 is 11 micrometers. It should be noted that a specific value of the gap 15 serves as an example and there is no specific limitation on it, as long as the above-mentioned gap 15 condition is satisfied.

It should be noted that the first voltage signal needs to eliminate the problem of capacitance asymmetry due to a change between the positive polarity and the negative polarity of the data line 21 of the driving substrate. For this purpose, the first voltage signal is greater than the data voltage signal of the driving substrate, wherein the data voltage signal is the signal transmitted on the data line 21. It should be noted that the first voltage signal is greater than a maximum value of the positive polarity of the data voltage signal to ensure that even if the positive polarity and the negative polarity of the data voltage signal changes, the first voltage signal is always greater than the data voltage signal, and an electric field direction of the capacitor formed by the data line 21 on the second metal layer 200 and the common electrode on the first metal layer 100 of the driving substrate is determined by the first voltage signal. Since the first voltage signal remains unchanged, so that the electric field direction of the capacitor remains unchanged. In one embodiment, the voltage of the first voltage signal is greater than or equal to 20V. For example, the voltage of the first voltage signal is 21 V, the voltage of the first voltage signal is 23 V, and the voltage of the first voltage signal is 25 V. It should be noted that a specific value of the first voltage signal is for example purposes, and there is no specific limitation on it, as long as the first voltage signal condition described above is satisfied.

For the shielding common electrode 11, a voltage of the second voltage signal transmitted by the shielding common electrode 11 must not be too high, wherein the voltage of the second voltage signal is too high to make the light-shielding portion 113 of the shielding common electrode 11 affect the liquid crystal ordering in the pixel and causes the light leakage phenomenon occurs. For this reason, the voltage of second voltage signal is less than the voltage of a critical voltage signal. It should be noted that the critical voltage signal is a minimum value that causes light leakage to occur in the driving substrate, and the light leakage phenomenon occurs when the second voltage signal is equal to or greater than the critical voltage signal of the pixel. In one embodiment, since the shielding common electrode 11 and the storage capacitance common electrode 13 are isolated from each other and do not connect, different voltage signals can be input to the shielding common electrode 11 and the storage capacitance common electrode 13, respectively. The voltage of the second voltage signal is less than the first voltage signal when different voltage signals are input separately. It is ensured that the shielding common electrode 11 transmits relatively low voltage for avoiding light leakage. The storage capacitance common electrode 13 transmits a high voltage with respect to each other for eliminating horizontal crosstalk phenomena. In another embodiment, the critical voltage signal is 14 V. The voltage of the second voltage signal is greater than or equal to 6 V and less than 14 V. For example, the voltage of the second voltage signal is 7 V, the voltage of the second voltage signal is 8 V, the voltage of the second voltage signal is 9 V, the voltage of the second voltage signal is 10 V, the voltage of the second voltage signal is 11 V, the voltage of the second voltage signal is 12 V, and the voltage of the second voltage signal is 13 V. It should be noted that the specific value of the second voltage signal is for example purpose and there is no specific limitation on it, as long as the second voltage signal conditions mentioned above are satisfied.

To facilitate the transmission of signals in the storage capacitance common electrode 13 of the present application, in one embodiment, a driving substrate is provided including a first signal source and a plurality of driving units 1. Each driving unit 1 includes a first metal layer 100. The first metal layer 100 includes a shielding common electrode 11 and a storage capacitance common electrode 13. A light-shielding portion 113 of the shielding common electrode 11 extends toward the storage capacitance common electrode 13. A pixel accommodating region is enclosed by the shielding common electrode 11 and the storage capacitance common electrode 13. There is a gap between the light-shielding portion 113 of the shielding common electrode 11 and the storage capacitance common electrode 13.

A first signal source is connected to the storage capacitance common electrode 13 and transmits a first voltage signal to the storage capacitance common electrode 13. A voltage of the first voltage signal is greater than a voltage of the data voltage signal transmitted in the data line 21 on the second metal layer 200 of the driving substrate. It should be noted that the first signal source is a voltage source. The first signal source may be a device that is directly provided on the driving substrate or may not be directly provided on a driving board, for example, also on a main control board of the LCD panel.

In order to facilitate transmission of signals of the shielding common electrode 11 and the storage capacitance common electrode 13 in the present application, in one embodiment, the driving substrate is provided including a first signal source, a second signal source, and a plurality of driving units 1. Each driving unit 1 includes a first metal layer 100. The first metal layer 100 includes a shielding common electrode 11 and a storage capacitance common electrode 13. A light-shielding portion 113 of the shielding common electrode 11 extends toward the storage capacitance common electrode 13, A pixel accommodating region is enclosed by the shielding common electrode 11 and the storage capacitance common electrode 13. There is a gap 15 between the light-shielding portion 113 of the shielding common electrode 11 and the storage capacitance common electrode 13.

The first signal source is connected to the storage capacitance common electrode 13 and transmits a first voltage signal to the storage capacitance common electrode 13. A voltage of the first voltage signal is greater than a voltage of the data voltage signal of the driving substrate. It should be noted that the first signal source is a voltage source. The first signal source may be a device that is directly provided on the driving substrate or may not be directly provided on a driving board, for example, also on the main control board of the LCD panel.

The second signal source is connected to the shielding common electrode 11 and transmits a second voltage signal to the shielding common electrode 11. It should be noted that the second signal source is a voltage source. The second signal source may or may not be directly provided on the driving substrate, for example, also a device on the main control board of the liquid crystal display panel.

Figure 7:
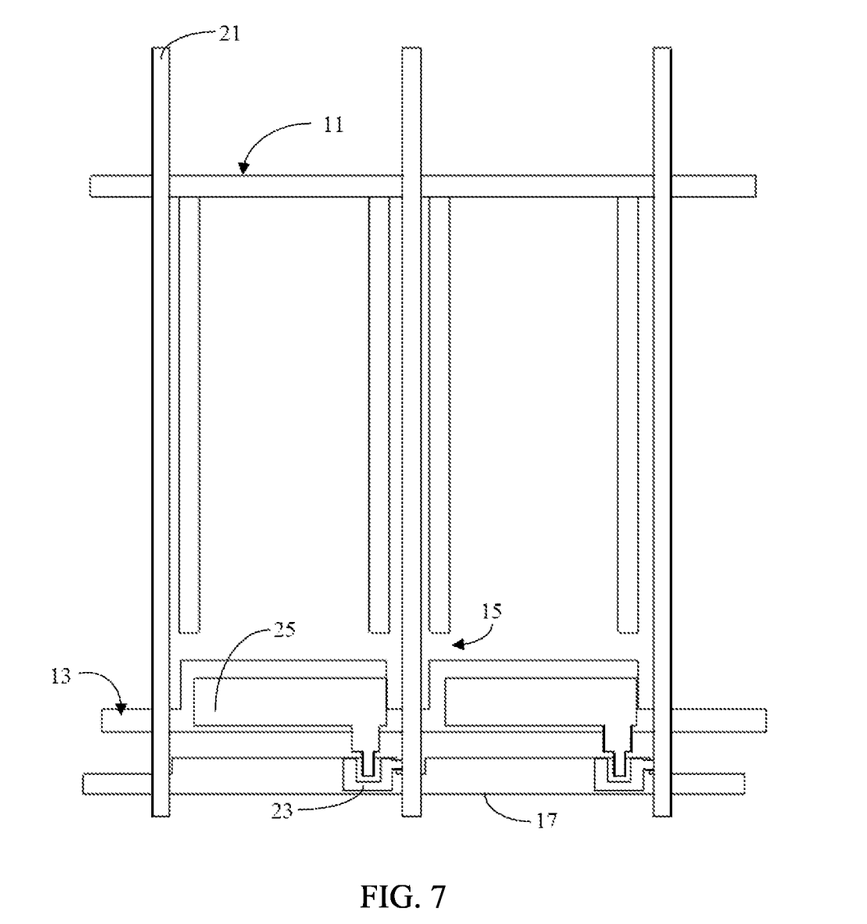
FIG. 7 is a schematic diagram of a structure of the driving substrate provided by one embodiment of the present application.

In addition, the driving unit 1 also includes a second metal layer 200 disposed in a heterolayer setting from the first metal layer 100, as shown in FIG. 6. The heterolayer setting means: after forming the first metal layer 100, a gate insulating layer 300 and a semiconductor layer 400 are formed on top of the first metal layer 100 in sequence, and then the second metal layer 200 is disposed on top of the semiconductor layer 400, as shown in FIG. 7, which provides a structure diagram of the heterolayer setting of the first metal layer 100 and the second metal layer 200. Due to the heterolayer setting, a common electrode on the first metal layer 100 and the data line 21 of the second metal layer 200 form a MIS capacitor. In this embodiment, the second metal layer 200 includes the data line 21, the drain electrode layer 25, and the source electrode layer 23. The first metal layer 100 also includes the gate scanning line 17, wherein the source electrode layer 23 is connected to the data line 21, and the source electrode layer 23 is provided corresponding to the gate scanning line 17. The source electrode layer 23 provided corresponding to the gate scanning line 17 means: a positive projection of the source electrode layer 23 falls on the gate scanning line 17. The drain electrode layer 25 is connected to the source electrode layer 23, and the drain electrode layer 25 is provided corresponding to the storage capacitance common electrode 13. The drain electrode layer 25 is provided corresponding to the storage capacitance common electrode 13 means: a positive projection of the drain electrode layer 25 falls on the storage capacitance common electrode 13. It should be noted that the drain electrode layer 25 includes a bump, and the source electrode layer 23 includes a groove, wherein the bump is provided in the space enclosed by the groove. The drain electrode layer 25 and the source electrode layer 23 form a part of the TFT.

In each embodiment of the driving substrate of the present application: The driving unit 1 includes a first metal layer 100. The first metal layer 100 includes a light-shielding portion 113. The light-shielding portion 113 of the shielding common electrode 11 extends toward the storage capacitance common electrode 13, wherein a pixel accommodating region is enclosed by the shielding common electrode 11 and the storage capacitance common electrode 13. There is a gap between the light-shielding portion 113 of the shielding common electrode 11 and the storage capacitance common electrode 13, there by the shielding common electrode 11 and the storage capacitance common electrode 13 are not connected to each other. A first voltage signal is input to the storage capacitance common electrode 13, and a voltage of the first voltage signal is greater than a voltage of the data voltage signal of the driving substrate. Since the voltage of the first voltage signal is greater than the voltage of the data voltage signal, an electric field direction of the MIS capacitor in the driving substrate is not changed when the data voltage signal switches between the positive polarity and the negative polarity, and the carriers in the MIS capacitor are not redistributed due to the data voltage signal switching between the positive polarity and the negative polarity, thereby making the MIS capacitor symmetrical and eliminating a horizontal line crosstalk phenomenon of conventional display panels.

In one embodiment, a display panel is provided including a control main board, a display layer, and a driving substrate as described above. The control main board is connected to the driving substrate. The driving substrate drives the deflection of the liquid crystal molecules in the display layer.

It should be noted that the driving substrate in this embodiment is the same as the driving substrate described in each embodiment of the driving substrate of the present application, please refer to each embodiment of the driving substrate of the present application for details, which will not be repeated here.

The technical features of the above-mentioned embodiments can be combined in any way, and for the sake of concise description, not all possible combinations of each technical feature of the above-mentioned embodiments are described. However, as long as there is no contradiction in the combination of these technical features, they should be considered as a scope of the present specification.

The above-mentioned embodiments express only several implementations of the present application, and their descriptions are more specific and detailed, but they should not be construed as a limitation of the scope of the patent application. It should be noted that for a person of ordinary skill in the art, a number of variations and improvements can be made without departing from the conception of the present application, and these belong to the scope of protection of the present application. Therefore, a scope of protection of the patent application shall be subject to the attached claims.

What is claimed is:

1. A driving substrate, comprising a plurality of driving units, wherein each of the driving units comprises a first metal layer, and wherein the first metal layer comprises a shielding common electrode and a storage capacitance common electrode,
   wherein a light-shielding portion of the shielding common electrode extends toward the storage capacitance common electrode,
   wherein a pixel accommodating region is enclosed by the shielding common electrode and the storage capacitance common electrode, and
   wherein there is a gap between the light-shielding portion of the shielding common electrode and the storage capacitance common electrode.

2. The driving substrate according to claim 1, wherein the storage capacitance common electrode transmits a first voltage signal, and wherein a voltage of the first voltage signal is greater than a voltage of a data voltage signal of the driving substrate.

3. The driving substrate according to claim 2, wherein the shielding common electrode transmits a second voltage signal, wherein a voltage of the second voltage signal is less than a voltage of a threshold voltage signal, and wherein the voltage of the threshold voltage signal is a minimum value that causes a light leakage of the driving substrate.

4. The driving substrate of claim 3, wherein the voltage of the second voltage signal is less than the voltage of the first voltage signal.

5. The driving substrate of claim 3, wherein the voltage of the first voltage signal is greater than or equal to 20V, and wherein the voltage of the second voltage signal is greater than or equal to 6V and less than 14V.

6. The driving substrate according to claim 2, wherein the driving substrate further comprises a first signal source,
   wherein the first signal source is connected to the storage capacitance common electrode, and transmits the first voltage signal to the storage capacitance common electrode.

7. The driving substrate according to claim 6, wherein the driving substrate further comprises a second signal source,
   wherein the second signal source is connected to the shielding common electrode and transmits a second voltage signal to the shielding common electrode, and wherein a voltage of the second voltage signal is less than the voltage of the first voltage signal.

8. The driving substrate according to claim 1, wherein the gap between the light-shielding portion of the shielding common electrode and the storage capacitance common electrode is greater than or equal to 5 micrometers and less than or equal to 15 micrometers.

9. The driving substrate according to claim 1, wherein the driving unit further comprises a second metal layer disposed in a different layer from the first metal layer;
   wherein the second metal layer comprises a data line, a drain electrode layer, and a source electrode layer, and wherein the first metal layer further comprises a gate scanning line; and
   wherein the source electrode layer is connected to the data line, and the source electrode layer is disposed corresponding to the gate scanning line, wherein the drain electrode layer is connected to the source electrode layer, and the drain electrode layer is disposed corresponding to the storage capacitance common electrode.

10. A display panel, comprising a control main board, a liquid crystal layer, and a driving substrate, wherein the driving substrate comprises a plurality of driving units, wherein each of the driving units comprises a first metal layer, and wherein the first metal layer comprises a shielding common electrode and a storage capacitance common electrode;
    wherein a light-shielding portion of the shielding common electrode extends toward the storage capacitance common electrode, wherein a pixel accommodating region is enclosed by the shielding common electrode and the storage capacitance common electrode, and wherein there is a gap between the light-shielding portion of the shielding common electrode and the storage capacitance common electrode; and
    wherein the control main board is connected to the driving substrate, and wherein the driving substrate is configured to drive the liquid crystal molecules in the liquid crystal layer to deflect.

11. The display panel according to claim 10, wherein the storage capacitance common electrode transmits a first voltage signal, and wherein a voltage of the first voltage signal is greater than a voltage of a data voltage signal of the driving substrate.

12. The display panel according to claim 11, wherein the shielding common electrode transmits a second voltage signal, wherein a voltage of the second voltage signal is less than a voltage of a threshold voltage signal, and wherein the voltage of the threshold voltage signal is a minimum value that causes a light leakage of the driving substrate.

13. The display panel according to claim 12, wherein the voltage of the second voltage signal is less than the voltage of the first voltage signal.

14. The display panel according to claim 12, wherein the voltage of the first voltage signal is greater than or equal to 20V, and wherein the voltage of the second voltage signal is greater than or equal to 6V and less than 14V.

15. The display panel according to claim 11, wherein the driving substrate further comprises a first signal source,
    wherein the first signal source is connected to the storage capacitance common electrode and transmits the first voltage signal to the storage capacitance common electrode.

16. The display panel according to claim 15, wherein the driving substrate further comprises a second signal source,
    wherein the second signal source is connected to the shielding common electrode and transmits a second voltage signal to the shielding common electrode, and wherein a voltage of the second voltage signal is less than the voltage of the first voltage signal.

17. The display panel according to claim 10, wherein the gap between the light-shielding portion of the shielding common electrode and the storage capacitance common electrode is greater than or equal to 5 micrometers and less than or equal to 15 micrometers.

18. The display panel according to claim 10, wherein the driving unit further comprises a second metal layer disposed in a different layer from the first metal layer;
- wherein the second metal layer comprises a data line, a drain electrode layer, and a source electrode layer, and wherein the first metal layer further comprises a gate scanning line; and
- wherein the source electrode layer is connected to the data line, and the source electrode layer is disposed corresponding to the gate scanning line, wherein the drain electrode layer is connected to the source electrode layer, and the drain electrode layer is disposed corresponding to the storage capacitance common electrode.

19. A driving substrate, comprising a plurality of driving units, wherein each of the driving units comprises a first metal layer, and wherein the first metal layer comprises a shielding common electrode and a storage capacitance common electrode;
- wherein a light-shielding portion of the shielding common electrode extends toward the storage capacitance common electrode, wherein a pixel accommodating region is enclosed by the shielding common electrode and the storage capacitance common electrode, and wherein there is a gap between the light-shielding portion of the shielding common electrode and the storage capacitance common electrode;
- wherein the storage capacitance common electrode transmits a first voltage signal, and wherein a voltage of the first voltage signal is greater than a voltage of a data voltage signal of the driving substrate; and
- wherein the gap between the light-shielding portion of the shielding common electrode and the storage capacitance common electrode is greater than or equal to 5 micrometers and less than or equal to 15 micrometers.

20. The driving substrate according to claim 19, wherein the shielding common electrode transmits a second voltage signal, wherein a voltage of the second voltage signal is less than a voltage of a threshold voltage signal, and wherein the voltage of the threshold voltage signal is a minimum value that causes a light leakage of the driving substrate.

* * * * *